United States Patent
Kataoka

(10) Patent No.: US 9,123,836 B2
(45) Date of Patent: Sep. 1, 2015

(54) SOLAR CELL SEALING FILM AND SOLAR CELL USING THE SAME

(75) Inventor: Hisataka Kataoka, Yokohama (JP)

(73) Assignee: BRIDGESTONE CORPORATION, Tokyo (JP)

(*) Notice: Subject to any disclaimer, the term of this patent is extended or adjusted under 35 U.S.C. 154(b) by 0 days.

(21) Appl. No.: 14/002,899

(22) PCT Filed: Feb. 21, 2012

(86) PCT No.: PCT/JP2012/054111
§ 371 (c)(1),
(2), (4) Date: Sep. 3, 2013

(87) PCT Pub. No.: WO2012/121003
PCT Pub. Date: Sep. 13, 2012

(65) Prior Publication Data
US 2013/0340828 A1    Dec. 26, 2013

(30) Foreign Application Priority Data
Mar. 9, 2011 (JP) ................. 2011-051068

(51) Int. Cl.
| *H01L 31/0203* | (2014.01) |
| *H01L 31/048* | (2014.01) |
| *C08J 5/18* | (2006.01) |
| *C08L 23/08* | (2006.01) |
| *C08K 5/14* | (2006.01) |
| *C08K 5/5425* | (2006.01) |

(52) U.S. Cl.
CPC ............ *H01L 31/0203* (2013.01); *C08J 5/18* (2013.01); *H01L 31/048* (2013.01); *H01L 31/0481* (2013.01); *C08J 2333/12* (2013.01); *C08K 5/14* (2013.01); *C08K 5/5425* (2013.01); *C08L 23/0869* (2013.01); *C08L 2203/204* (2013.01); *C08L 2312/08* (2013.01); *Y02E 10/50* (2013.01)

(58) Field of Classification Search
CPC ............ H01L 31/048; H01L 31/0481; H01L 31/0203; Y02E 10/50
USPC .................................... 136/251, 259
See application file for complete search history.

(56) References Cited

U.S. PATENT DOCUMENTS

| 2010/0073656 A1 | 3/2010 | Inoue et al. |
| 2010/0229944 A1 | 9/2010 | Nishijima et al. |

FOREIGN PATENT DOCUMENTS

| JP | 06-299125 A | 10/1994 |
| JP | 08-148708 A | 6/1996 |

(Continued)

OTHER PUBLICATIONS

International Search Report for PCT/JP2012/054111, dated Mar. 19, 2012.

(Continued)

*Primary Examiner* — James Lin
*Assistant Examiner* — Dujuan Horton
(74) *Attorney, Agent, or Firm* — Sughrue Mion, PLLC

(57) ABSTRACT

The solar cell sealing film according to the present invention includes ethylene-methyl methacrylate copolymer, a crosslinker and a silane coupling agent, wherein the crosslinker is contained in an amount of 0.05 to 0.7 part by weight, based on 100 parts by weight of the ethylene-methyl methacrylate copolymer, and the silane coupling agent is contained in an amount of 0.1 to 0.7 part by weight based on 100 parts by weight of the ethylene-methyl methacrylate copolymer, and wherein the ethylene-methyl methacrylate copolymer has a methyl methacrylate content of 25 to 35% by weight.

5 Claims, 1 Drawing Sheet

(56) References Cited

FOREIGN PATENT DOCUMENTS

| | | |
|---|---|---|
| JP | 2000-186114 A | 7/2000 |
| JP | 2002111018 A | 4/2002 |
| JP | 2005-126708 A | 5/2005 |
| JP | 2008-153520 A | 7/2008 |
| WO | 2007/094445 A1 | 8/2007 |
| WO | 2010140608 A1 | 12/2010 |

OTHER PUBLICATIONS

Communication dated Jan. 28, 2015, issued by the European Patent Office in counterpart Application No. 12755072.

SOLAR CELL SEALING FILM AND SOLAR CELL USING THE SAME

CROSS REFERENCE TO RELATED APPLICATIONS

This application is a National Stage of International Application No. PCT/JP2012/054111 filed Feb. 21, 2012, claiming priority based on Japanese Patent Application No. 2011-051608 filed Mar. 9, 2011, the contents of all of which are incorporated herein by reference in their entirety.

TECHNICAL FIELD

The present invention relates to a solar cell sealing film which has high adhesion and excellent durability under high temperature and high humidity, and to a solar cell using the solar cell sealing film.

BACKGROUND ART

In recent years, a solar cell (solar cell module) has been widely employed as a device directly converting solar energy into electric energy from the viewpoints of the effective use of natural resources and the prevention of environmental pollution. The development of the solar cell is being carried out in terms of productivity and durability.

As shown in FIG. 1, the solar cell is generally prepared by super-posing a transparent front side (light-receiving side) protection material 11 such as a glass plate, a front side (light-receiving side) sealing film 13A, photovoltaic elements (e.g., photovoltaic elements made of silicon) 14, a backside sealing film 13B and a backside protection material (backside covering member) 12, in this order, and degassing them under reduced pressure, and then heating the front side sealing film 13A and the backside sealing film 13B under application of pressure to crosslink and cure the films, whereby they are bonded and combined. In the conventional solar cell, a plurality of photovoltaic elements 14 are connected with each other in order to generate high electric output. Therefore, in order to ensure insulation properties between the photovoltaic elements 14, the photovoltaic elements 14 are sealed with the front side sealing film 13A and the backside sealing film 13B which have high insulation properties.

As the sealing films 13A, 13B, a film made of ethylene-vinyl acetate copolymer (EVA) is heretofore used because of low cost and high transparency and adhesion (for example, Patent Document 1). In addition, in order to ensure mechanical durability of a solar cell and prevent occurrence of corrosion of conductive wires or electrodes in the solar cell caused by permeation of moisture or water, the materials of the solar cell are bonded and combined so as to have high adhesion and bonding strength by cross-linking the EVA film by using a crosslinker.

However, EVA comprising vinyl acetate as the constituent tends to form acetic acid over time because the EVA is hydrolyzed by moisture at high temperature at which the solar cell is installed. The acetic acid may lead to promote occurrence of corrosion of the conductive wires or electrodes in the solar cell. For this reason, sealing films prepared using a resin other than EVA have been developed. As the sealing films using a resin other than EVA, Patent Document 2 discloses a sealing film prepared using an ethylene-unsaturated carboxylic acid copolymer or ionomer thereof, and Patent Document 3 discloses a sealing film prepared using a mixture of ethylene-methyl acrylate copolymer and EVA.

PRIOR ART DOCUMENTS

Patent Document

Patent Document 1: JP (TOKKAI) 2008-153520 A
Patent Document 2: JP (TOKKAI) 2000-186114 A
Patent Document 3: JP (TOKKAI) 2005-126708 A

SUMMARY OF THE INVENTION

Problem to be Solved by the Invention

Although the sealing film described in Patent Document 2 is excellent in productivity, the film shows insufficient adhesion to other materials (protection materials and photovoltaic elements) because the film is not cross-linked. Meanwhile, although the sealing film described in Patent Document 3 is cross-linked, the film still forms acetic acid because it is made of a mixture of ethylene-methyl acrylate copolymer and EVA. In addition, bubble formation occurs due to the crosslinker and thus the adhesion is reduced.

It is therefore an object of the present invention is to provide a solar cell sealing film which is prevented from corrosion due to acids and is reduced in bubble formation, and which has high adhesion, which is kept even under a severe condition of high temperature and high humidity. A further object of the present invention is to provide a solar cell using the sealing film having improved power generation efficiency and excellent durability.

Means for Solving Problem

The bubble formation is caused by gases generated by thermal decomposition of a crosslinker contained in a sealing film in the cross-linking step for sealing photovoltaic elements. That is to say, it is considered that gases by thermal decomposition of a crosslinker remain at the boundaries among a backside protection material, a backside sealing film, photovoltaic elements, a front side sealing film and a front side protection material in a solar cell, which brings about occurrence of bubble in the solar cell. In contrast, if cross-linking is not carried out, not only sufficient adhesion but also sufficient durability under a condition of high temperature and high humidity cannot be obtained. Thus, the inventor has found that the above-mentioned problems can be solved by using, as a base polymer, a polymer which does not form any acids, and by including a crosslinker in a minimally necessary amount and a silane coupling agent enhancing adhesion in a specific amount.

Accordingly, the above-mentioned object is achieved by a solar cell sealing film comprising ethylene-methyl methacrylate copolymer, a crosslinker and a silane coupling agent, wherein the crosslinker is contained in an amount of 0.05 to 0.7 part by weight based on 100 parts by weight of the ethylene-methyl methacrylate copolymer, and the silane coupling agent is contained in an amount of 0.1 to 0.7 part by weight based on 100 parts by weight of the ethylene-methyl methacrylate copolymer, and wherein the ethylene-methyl methacrylate copolymer has a methyl methacrylate content of 25 to 35% by weight.

The preferred embodiments of the present invention are as follows:

(1) The weight ratio of the crosslinker to the silane coupling agent is in the range of 0.2 to 0.5. When the weight ratio is within this range, bubble formation is effectively reduced and the adhesion is markedly improved. In addition, the improved adhesion can be kept under high temperature and high humidity.

(2) The crosslinker is an organic peroxide.
(3) The organic peroxide is a dialkyl peroxide.
(4) The silane coupling agent is a methacryloxy-type silane coupling agent.

In addition, the above-mentioned object is achieved by a solar cell obtained by using the above-mentioned solar cell sealing film.

Effect of the Invention

The solar cell sealing film of the present invention has excellent adhesion and durability. Therefore, a solar cell obtained by using the solar cell sealing film of the present invention brings about the reduction of the bubble formation and of peeling at the boundaries between the sealing film and protection materials and thus enables to maintain high power generation efficiency over a long period of time from the initial operation.

DESCRIPTION OF EMBODIMENTS

Figure 1:
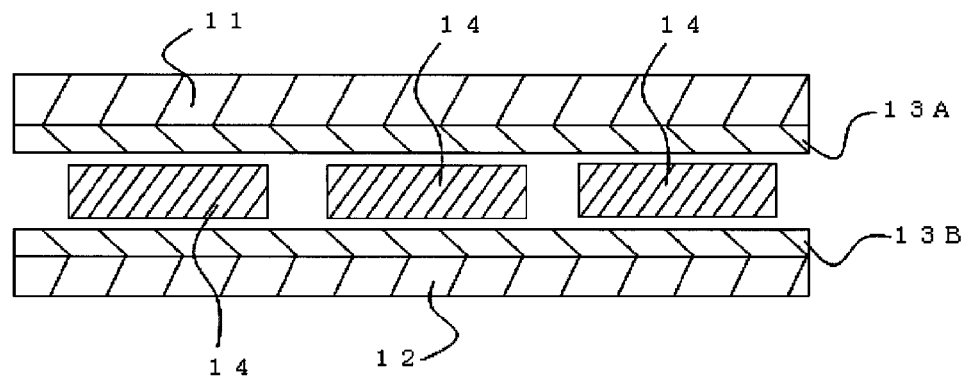
FIG. 1 is a schematic sectional view of a conventional solar cell.

As described above, a solar cell sealing film of the present invention uses ethylene-methyl methacrylate copolymer as a base polymer, and comprises from 0.05 to 0.7 part by weight of a crosslinker and from 0.1 to 0.7 part by weight of a silane coupling agent, in each case based on 100 parts by weight of the ethylene-methyl methacrylate copolymer. The ethylene-methyl methacrylate copolymer has a methyl methacrylate content of 25 to 35% by weight. The combination of the crosslinker in a necessary minimum amount with the silane coupling agent enables to reduce bubble formation to give high adhesion and improved durability under high temperature and high humidity. Furthermore, the use of ethylene-methyl methacrylate copolymer as a base polymer for a solar cell sealing film prevents formation of acids, and thus suppresses corrosion of electrodes and wires and reduction of adhesion. Ethylene-methyl methacrylate copolymer is suitable as a base polymer for a solar cell sealing film because of its high transparency whereby sunlight can be sufficiently introduced into photovoltaic elements.

The materials used in the present invention are described below.

[Ethylene-Methyl Methacrylate Copolymer]

Ethylene-methyl methacrylate copolymer (EMMA) is a copolymer which can be obtained from ethylene and methyl methacrylate (MMA) as monomers. In the present invention, the content of methyl methacrylate in ethylene-methyl methacrylate copolymer is in the range of 25 to 35% by weight, preferably 25 to 30% by weight. When the content is less than 25% by weight, the transparency may be reduced. When the content is greater than 35% by weight, the processability may be reduced.

The ethylene-methyl methacrylate copolymer has preferably Melt Flow Rate according to JIS K 7210 of not more than 35 g/10 min., especially 7 to 20 g/10 min. The use of a solar cell sealing film made of the ethylene-methyl methacrylate copolymer having Melt Flow Rate specified as above makes it possible to suppress the phenomenon that the sealing film spreads out of a substrate due to its melt or position gap in a heating and pressurizing procedure of the sealing step for preparing a solar cell, thereby obtaining high sealing performance. The value of the Melt Flow Rate (MFR) is determined under the conditions of temperature of 190° C. and load of 21.18N according to JIS K 7210.

The solar cell sealing film of the present invention may secondarily contain polyvinyl acetal resin such as polyvinyl formal, polyvinyl butyral (PVB resin) or modified PVB, or vinyl chrolide resin, in addition to ethylene-methyl methacrylate copolymer. The PVB resin is preferred.

[Crosslinker]

The crosslinker enables the formation of the crosslinked structure of ethylene-methyl methacrylate copolymer. An organic peroxide or photopolymerization initiator is preferably used as the crosslinker. The organic peroxide is more preferably used because the resultant sealing film is improved in temperature dependencies in adhesion, transparency, humidity resistance and penetration resistance.

Any organic peroxides that can be decomposed at a temperature of not less than 100° C. to generate radical(s) can be employed as the above-mentioned organic peroxide. The organic peroxide is selected in the consideration of film-forming temperature, conditions for preparing the composition, curing (bonding) temperature, heat resistance of body to be bonded, storage stability. Especially, preferred are those having a decomposition temperature of not less than 70° C. in a half-life of 10 hours.

From the viewpoint of resin processing temperature and storage stability, examples of the organic peroxides include benzoyl peroxide-type cure agents, t-hexyl peroxypyvalate, t-butyl peroxypyvalate, 3,5,5-trimethyl hexanoyl peroxide, di-n-octanoyl peroxide, lauroyl peroxide, stearoyl peroxide, 1,1,3,3-tetramethylbutylperoxy-2-ethyl hexanoate, succinic acid peroxide, α,α'-bis(t-butylperoxyisopropyl)benzene, dicumyl peroxide, di-t-hexyl peroxide, 2,5-dimethyl-2,5-di(t-butylperoxy)hexane, t-butylcumyl peroxide, di-t-butyl peroxide, 2,5-dimethyl-2,5-di(2-ethylhaxanoylperoxy)hexane, 1-cyclohexyl-1-methylethylperoxy-2-ethyl hexanoate, t-hexylperoxy-2-ethyl hexanoate, 4-methylbenzoyl peroxide, t-butylperoxy-2-ethyl hexanoate, m-toluoyl+benzoyl peroxide, benzoyl peroxide, 1,1-bis(t-butylperoxy)-2-methylcyclohexanate, 1,1-bis(t-hexylperoxy)-3,3,5-trimethylcyclohexanate, 1,1-bis(t-hexylperoxy)cyclohexanate, 1,1-bis(t-butylperoxy)-3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclododecane, t-hexylperoxyisopropyl monocarbonate, t-butylperoxy maleic acid, t-butylperoxy-3,3,5-trimethyl hexane, t-butyl peroxylaurate, 2,5-dimethyl-2,5-di(methylbenzoylperoxy)hexane, t-butylperoxyisopropyl monocarbonate, t-butylperoxy-2-ethylhexyl monocarbonate, t-hexyl peroxybenzoate, and 2,5-dimethyl-2,5-di(benzoylperoxy)hexane.

As the benzoyl peroxide-type cure agents, any organic peroxides that can be decomposed at a temperature of not less than 70° C. to generate radical(s) can be employed. Especially, preferred are those having a decomposition temperature of not less than 50° C. in a half-life of 10 hours. The benzoyl peroxide-type cure agents is selected in the consideration of conditions for preparing the composition, film-forming temperature, curing (bonding) temperature, heat resistance of body to be bonded, storage stability. Examples of the benzoyl peroxide-type cure agents include benzoyl peroxide, 2,5-dimethylhexyl-2,5-bisperoxy benzoate, p-chlorobenzoyl peroxide, m-toluoyl peroxide, 2,4-dicyclobenzoyl peroxide, t-butylperoxy benzoate. The benzoyl peroxide-type cure agents can be employed singly or in combination of two or more kinds.

The organic peroxides are preferably dialkyl peroxides such as α,α'-bis(t-butylperoxyisopropyl)benzene, dicumyl peroxide, di-t-hexyl peroxide, 2,5-dimethyl-2,5-di(t-butylperoxy)hexane, t-butylcumyl peroxide and di-t-butyl peroxide. The use of the dialkyl peroxides scarcely forms gases by decomposition thereof, and brings about high enhancement of the cross-linking density of ethylene-methyl methacrylate copolymer. Therefore the durability of the solar cell sealing film can be further improved.

The organic peroxide is contained in an amount of 0.05 to 0.7 part by weight, preferably 0.1 to 0.3 part by weight, based on 100 parts by weight of the ethylene-methyl methacrylate copolymer. When the peroxide is used in an amount of less than 0.05 part by weight, the cross-linking reaction is slower not to give sufficient adhesion. When the peroxide is contained in an amount of more than 0.7 part by weight, bubble is apt to generate.

As the photopolymerization initiators, any known photopolymerization initiators can be employed. Preferred are initiators having good storage stability after addition thereof. Examples of the photopolymerization initiators include acetophenone type initiators such as 2-hydroxy-2-methyl-1-phenylpropane-1-on, 1-hydroxycyclohexylphenylketone, 2-methyl-1-[4-(methylthio)phenyl]-2-morphorino-propane-1-on, benzoin type initiators such as benzylmethylketal; and benzophenone type initiators such as benzophenone, 4-phenylbenzophenone and hydroxybenzophenone; thioxanthone type initiators such as isopropylthioxanthone and 2,4-diethylhioxanthone. Further, as special type, there can be mentioned methylphenylglyoxylate. Especially preferred are 2-hydroxy-2-methyl-1-phenylpropane-1-on, 1-hydroxycyclohexylphenylketone, 2-methyl-1-[4-(methylthio)phenyl]-2-morphorinopropane-1-on and benzophenone. These photopolymerization initiators can be employed, if necessary, together with one or more kinds of a photopolymerization promoter such as a benzoic acid type compound (e.g., 4-dimethylaminobezoic acid) or a tertiary amine compound by mixing the initiator with the promoter in optional ratio. The initiator can be employed singly or in combination of two or more kinds.

The photopolymerization initiator is contained in an amount of 0.05 to 0.7 part by weight, preferably 0.1 to 0.3 part by weight, based on 100 parts by weight of the ethylene-methyl methacrylate copolymer. When the photopolymerization initiator is used in an amount of less than 0.05 part by weight, the cross-linking reaction is slower not to give sufficient adhesion. When the photopolymerization initiator is contained in an amount of more than 0.7 part by weight, bubble is apt to generate.

[Silane Coupling Agent]

The examples of the silane coupling agent used in the present invention include γ-methacryloxypropyltrimethoxysilane, γ-methacryloxypropylmethyldiethoxysilane, γ-methacryloxypropyltriethoxysilane, γ-methacryloxypropylmethyldimethoxysilane, γ-chloropropylmethoxysilane, vinyltriethoxysilane, vinyl-tris(β-methoxyethoxy)silane, vinyltriacetoxysilane, γ-glycidoxypropyltrimethoxysilane, γ-glycidoxypropyltriethoxysilane, β-(3,4-epoxycyclohexyl) ethyltrimethoxysilane, vinyltrichlorosilane, γ-mercaptopropyltrimethoxysilane, γ-aminopropyltriethoxysilane and N-β-(aminoethyl)-γ-aminopropyltrimethoxysilane.

Of these silane coupling agents, preferred are methacryloxy-type silane coupling agents which refer to silane coupling agents having a methacryloxy group. Examples of the methacryloxy-type silane coupling agents include γ-methacryloxypropyltrimethoxysilane, γ-methacryloxypropylmethyldiethoxysilane, γ-methacryloxypropyltriethoxysilane, and γ-methacryloxypropylmethyldimethoxysilane. γ-methacryloxypropyltrimethoxysilane is particularly preferred. The silane coupling agent can be employed singly or in combination of two or more kinds.

The silane coupling agent is contained in the solar cell sealing film of the present invention in an amount of 0.1 to 0.7 part by weight, preferably 0.3 to 0.65 part by weight, based on 100 parts by weight of the ethylene-methyl methacrylate copolymer. When the silane coupling agent is contained in an amount of less than 0.1 part by weight, sufficient adhesion cannot be obtained. When the silane coupling agent is contained in an amount of more than 0.7 part by weight, the silane coupling agent may bleed out.

In the present invention, the weight ratio of the crosslinker to the silane coupling agent (crosslinker/silane coupling agent) is preferably in the range of 0.2 to 0.5. The use of the crosslinker in an amount as little as possible and the silane coupling agent in a relatively large amount improves the adhesion with suppressing the bubble formation.

[Others]

The solar cell sealing film prior to crosslinking may further contain a crosslinking auxiliary. The crosslinking auxiliary enables the enhancement of gel fraction of ethylene-methyl methacrylate copolymer and the improvement of adhesion and durability of the sealing film.

The crosslinking auxiliary is preferably used in the range of 0.1 to 3.0 parts by weight, more preferably 0.1 to 2.5 parts by weight, based on 100 parts by weight of ethylene-methyl methacrylate copolymer. By setting the ranges as above, occurrence of gases due to the addition of the crosslinking auxiliary can be suppressed, and the cross-linking density of the ethylene-methyl methacrylate copolymer can be improved.

Examples of the crosslinking auxiliary (compounds having radical polymerizable groups as functional groups) include trifunctional crosslinking auxiliaries such as triallyl cyanurate and triallyl isocyanurate, and mono- or bifunctional crosslinking auxiliaries of (meth)acryl esters (e.g., NK Ester, etc.). Among these, triallyl cyanurate and triallyl isocyanurate are preferred. Triallyl isocyanurate is particularly preferred.

The solar cell sealing film of the invention can contain, if necessary, various additives such as plasticizers, acryloxy group-containing compounds and/or methacryloxy group-containing compounds and/or epoxy group-containing compounds, for improvement or adjustment of various properties of the film (e.g., mechanical strength, optical characteristics such as transparency, heat resistance, light resistance and cross-linking rate), in particular for improving the mechanical strength.

Though any plasticizers can be used with not restricted, esters of polybasic acids and esters of polyhydric alcohols are generally used. Examples of the esters include dioctyl phthalate, dihexyl adipate, triethyllene glycol-di-2-ethylbutylate, butyl sebacate, tetraethylene glycol diheptanoate, triethylene glycol diperalgonate. The plasticizer may be used singly or in combination of two or more kinds. The plasticizer is preferably contained in an amount of not more than 5 parts by weight based on 100 parts by weight of ethylene-methyl methacrylate copolymer.

Examples of the acryloxy or methacryloxy group-containing compounds include generally derivatives of acrylic acid or methacrylic acid, such as esters and amides of acrylic acid or methacrylic acid. Examples of the ester residue include linear alkyl groups (e.g., methyl, ethyl, dodecyl, stearyl and lauryl), a cyclohexyl group, a tetrahydrofurfuryl group, an aminoethyl group, a 2-hydroxyethyl group, a 3-hydroxypropyl group, 3-chloro-2-hydroxypropyl group. Example of the amide includes diacetone acrylamide. Further, examples of the esters include esters of acrylic acid or methacrylic acid with polyhydric alcohol such as ethylene glycol, triethylene glycol, polypropylene glycol, polyethylene glycol, trimethylol propane or pentaerythritol.

Examples of the epoxy group-containing compounds include triglycidyl tris(2-hydroxyethyl)isocyanurate, neopentylglycol diglycidyl ether, 1,6-hexanediol diglycidyl ether, allyl glycidyl ether, 2-ethylhexyl glycidyl ether, phenyl glycidyl ether, phenol(ethyleneoxy)$_5$glycidyl ether, p-t-butylphenyl glycidyl ether, diglycidyl adipate, diglycidyl phthalate, glycidyl methacrylate and butyl glycidyl ether.

The content of the acryloxy group-containing compounds, the methacryloxy group-containing compounds or the epoxy group-containing compounds is preferably used in the range of 0.5 to 5.0 parts by weight, especially 1.0 to 4.0 parts by weight based on 100 parts by weight of ethylene-methyl methacrylate copolymer.

The sealing film of the present invention may further contain antioxidants. Examples of the antioxidants include hindered phenol-type antioxidants such as N,N'-hexan-1,6-diyl-bis[3-(3,5-di-t-butyl-4-hydroxyphenyl) propionamide], phosphorus-type heat stabilizers, lactone-type heat stabilizers, vitamin E-type heat stabilizers and sulfur-type heat stabilizers.

[Process for Preparing the Solar Cell Sealing Film]

The solar cell sealing film can be prepared according to known processes. The solar cell sealing film can be prepared, for example, by a process in which a composition comprising the above-mentioned materials is molded by using conventional extrusion molding or calendar molding (calendaring) to prepare a product in the form of sheet. Otherwise, the solar cell sealing film can be prepared by dissolving the abovementioned composition in a solvent to form a solution, applying the solution onto an appropriate support by an appropriate coater and drying it to form a coated film (product in the form of sheet). The heating temperature in the film-formation is preferably selected such that the crosslinker is not reacted or scarcely reacted. For example, the heating temperature is preferably in the range of 50 to 90° C., especially 40 to 80° C. The thickness of the solar cell sealing film, though is not particularly restricted, is preferably in the range of 0.05 to 2 mm.

[Solar Cell]

The structure of the solar cell is not particularly restricted, as long as the solar cell sealing film according to the invention is used. For example, there can be mentioned a structure comprising a transparent front side protection material, a backside protection material and photovoltaic elements sealed therebetween with the solar cell sealing films of the invention, which is obtained by curing the sealing films and combining them. In the invention, the side (light receiving side) which is exposed to light for photovoltaic elements of a solar cell is referred to as "front side", while the side opposite to the light receiving side of photovoltaic elements of a solar cell is referred to as "backside".

In order to sufficiently seal photovoltaic elements, for example, as shown in FIG. 1, a transparent front side protection material 11, a front side sealing film 13A, photovoltaic elements 14, a backside sealing film 13B and a backside protection material 12 are superposed to prepare a laminate and the laminate is crosslinked or cured according to a conventional process including heating and pressuring steps.

The laminate can be bonded, for example, under the application of pressure and heat by using a vacuum laminator in the conditions of temperature of 135 to 180° C., preferably 140 to 180° C., especially 155 to 180° C., degassing time period of 0.1 to 5 min., pressing pressure of 0.1 to 1.5 kg/cm$^2$ and pressing time period of 5 to 15 min. This application of pressure and heat enables the ethylene-methyl methacrylate copolymer contained in the front side sealing film 13A and the backside sealing film 13B to crosslink, whereby the photovoltaic elements 14, the transparent front side protection material 11 and the backside protection material 12 are combined through the front side sealing film 13A and the backside sealing film 13B to seal the photovoltaic elements 14.

The solar cell sealing film of the invention can be used in not only solar cells using photovoltaic elements composed of single or poly crystal-type silicon crystal, but also thin-film solar cells such as thin-film silicon-type solar cell, thin-film amorphous silicon-type solar cell and copper selenide-induim (CIS)-type solar cell. Examples of the structures of the thin-film solar cells include the structure that the solar cell sealing film of the invention and a backside protection material are superposed on a thin-film solar cell element which is formed by chemical phase deposition method on a transparent front (light-receiving) side protection material such as a glass plate, a polyimide substrate or a fluoro resin transparent substrate, and the resultant laminate is bonded and united; the structure that the solar cell sealing film of the present invention and a transparent front side protection material are superposed on a thin-film solar cell element which is formed on a backside protection material, and the resultant laminate is bonded and united; or the structure that a transparent front side protection material, the front side sealing film of the present invention, a thin-film solar cell element, the backside sealing film of the present invention and a backside protection material are superposed in this order and the resultant laminate is bonded and united.

The transparent front side protection material 11 used in the solar cell of the invention is generally a glass plate such as silicate glass. A thickness of the glass plate is generally in the range of 0.1 to 10 mm, preferably 0.3 to 5 mm. The glass plate may be tempered in heat or chemical resistance.

As the backside protection material 12 used in the invention, a plastic film made of polyethylene telephthalate (PET) or polyamides is preferably used. The backside protection material 12 may be a fluorinated polyethylene film (especially a film in which fluorinated polyethylene film/Al/fluorinated polyethylene film are laminated in this order) from the viewpoint of heat resistance and heat and humidity resistance.

The solar cell (including a thin-film solar cell) of the invention is characterized in use of the specific sealing films provided on front side and/or backside. Therefore as materials used in components other than the sealing film (i.e., transparent front side protection material, backside protection material, and photovoltaic elements, etc.), those used in a known solar cell can be used, which are not particularly restricted.

EXAMPLES

The invention is illustrated in detail using the following Examples.

Examples 1-20, Comparison Examples 1-22

The materials of the formulation set forth in Tables 1-5 were introduced into a roll mill and kneaded at 70° C. to prepare a composition for a solar cell sealing film. The composition for a solar cell sealing film was subjected to calendaring processing at 70° C. and then cooled to give a solar cell sealing film.

[Evaluation Methods]

(1) Initial Adhesion to Glass

Figure 2:
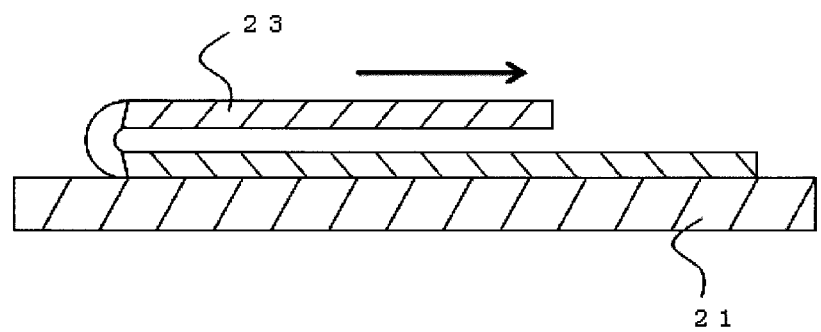
FIG. 2 is a schematic view for explaining a 180° peel test method for evaluation of adhesion.

The solar cell sealing film (thickness: 0.6 mm) was placed on a float glass (glass plate) having a thickness of 3 mm, and was temporarily bonded by application of pressure for 10 minutes by using a vacuum laminator which was set at 100° C. to give a laminate. The sealing film of the laminate was cross-linked by heating it in an oven which was set at 155° C. for 45 minutes. According to JIS K 6854, adhesion to glass (N/cm) of the sealing film was determined, as shown in FIG. 2, by peeling a part of the sealing film 23 from the glass plate 21 and folding the sealing film 23 at an angle of 180°, and then measuring peel strength at a tensile speed of 100 mm/min by means of a tensile testing machine (Autograph, manufactured by Shimadzu Co., LTD). The measured peel strength denotes the adhecion to glass.

(2) Adhesion after a Heat-Humidity Resistance Test

A laminate prepared in the same manner as (1) was placed in a humidity oven which was set at 85° C. and 85% RH for 4000 hours. Then adhesion to glass was determined in the same manner as (1).

(3) Bubble Formation Test

A glass plate (front side protection material)/the solar cell sealing film/photovoltaic elements/the solar cell sealing film/a back side protection material (back sheet made of a polyamide resin: ICOSOLAR 3554 from ISOVOLTA) were superposed in this order, by using the above-mentioned solar cell sealing film (thickness: 0.6 mm), and they were temporarily bonded by applying pressure for 10 minutes by using a vacuum laminator which was set at 100° C. to give a laminate. The laminate was placed in an oven which was set at 155° C., and a time requiring for the beginning of bubble formation was measured.

(4) Light Transmittance

A laminate in which the solar cell sealing film (thickness: 0.6 mm) was sandwiched with two release PET films (thickness: 100 μm) was temporarily bonded at 90° C. in conditions of a vacuum time of 2 minutes and a press time of 8 minutes by means of a vacuum laminator. The laminate was subsequently heated for 45 minutes in an oven which was set at 155° C. to crosslink the film. Light transmittance spectrums of the laminate were measured in wavelength range of 300 to 1,200 nm by using a spectrophotometer (U-4000, manufactured by Hitachi Co., Ltd.) and an average value was calculated.

The results are shown in Tables 1-5.

TABLE 1

| | | Ex. 1 | Ex. 2 | Ex. 3 | Ex. 4 | Ex. 5 | Ex. 6 | Ex. 7 | Ex. 8 | Ex. 9 | Ex. 10 | Ex. 11 |
|---|---|---|---|---|---|---|---|---|---|---|---|---|
| Formulation (parts by weight) | Base polymer 1[*1] | 100 | 100 | 100 | 100 | 100 | 100 | 100 | 100 | 100 | 100 | 100 |
| | Base polymer 2[*2] | — | — | — | — | — | — | — | — | — | — | — |
| | Base polymer 3[*3] | — | — | — | — | — | — | — | — | — | — | — |
| | Base polymer 4[*4] | — | — | — | — | — | — | — | — | — | — | — |
| | Base polymer 5[*5] | — | — | — | — | — | — | — | — | — | — | — |
| | Crosslinker[*6] | 0.3 | 0.3 | 0.3 | 0.65 | 0.65 | 0.65 | 0.1 | 0.1 | 0.1 | 0.09 | 0.7 |
| | Silane couping agent[*7] | 0.1 | 0.3 | 0.65 | 0.1 | 0.3 | 0.65 | 0.1 | 0.3 | 0.65 | 0.65 | 0.7 |
| | Weight ratio of Crosslinker/Silane coupling agent | 3.0 | 1.0 | 0.5 | 6.5 | 2.2 | 1.0 | 1.0 | 0.3 | 0.2 | 0.1 | 1.0 |
| Evaluation | Initial adhesion to glass (N/cm) | 26.0 | 25.3 | 26.0 | 23.1 | 23.2 | 23.4 | 26.1 | 27.1 | 26.5 | 19.1 | 18.8 |
| | Adhesion after heat-humidity test (N/cm) | 15.5 | 17.4 | 19.1 | 16.1 | 18.8 | 18.1 | 19.1 | 18.8 | 20.3 | 11.1 | 14.1 |
| | Bubble formation time (min) | 180 | 180 | 190 | 120 | 120 | 125 | 200< | 200< | 200< | 200< | 130 |
| | Light transmittance (300-1200 nm) | 91.6 | 91.6 | 91.6 | 91.5 | 91.5 | 91.4 | 91.4 | 91.4 | 91.4 | 91.3 | 91.4 |

Note)
[*1] Ethylene-methyl methacrylate copolymer: Acryft WK402 (MMA content: 25 wt %, MFR: 20 g/10 min) manufactured by Sumitomo Chemical
[*2] Ethylene-methyl methacrylate copolymer: Acryft WK307 (MMA content: 25 wt %, MFR: 7 g/10 min) manufactured by Sumitomo Chemical
[*3] Ethylene-methyl methacrylate copolymer: Acryft WK401 (MMA content: 20 wt %, MFR: 20 g/10 min) manufactured by Sumitomo Chemical
[*4] Ethylene-methyl methacrylate copolymer: Acryft WK206 (MMA content: 20 wt %, MFR: 2 g/10 min) manufactured by Sumitomo Chemical
[*5] Ethylene-vinyl acetate copolymer (EVA): Ultrasen 634 (VA content: 26 wt %, MFR: 4.3 g/10 min) manufactured by Tosoh
[*6] 2,5-dimethyl-2,5-di(t-butylperoxy)hexane: Perhexa 25B manufactured by NOF Corporation
[*7] γ-methacryloxypropyltrimethoxysilane: KBM 503 manufactured by Shin-Etsu Chemical Co., Ltd

TABLE 2

| | | Ex. 12 | Ex. 13 | Ex. 14 | Ex. 15 | Ex. 16 | Ex. 17 | Ex. 18 | Ex. 19 | Ex. 20 |
|---|---|---|---|---|---|---|---|---|---|---|
| Formulation (parts by weight) | Base polymer 1[*1] | — | — | — | — | — | — | — | — | — |
| | Base polymer 2[*2] | 100 | 100 | 100 | 100 | 100 | 100 | 100 | 100 | 100 |
| | Base polymer 3[*3] | — | — | — | — | — | — | — | — | — |
| | Base polymer 4[*4] | — | — | — | — | — | — | — | — | — |
| | Base polymer 5[*5] | — | — | — | — | — | — | — | — | — |
| | Crosslinker[*6] | 0.3 | 0.3 | 0.3 | 0.65 | 0.65 | 0.65 | 0.1 | 0.1 | 0.1 |
| | Silane couping agent[*7] | 0.1 | 0.3 | 0.65 | 0.1 | 0.3 | 0.65 | 0.1 | 0.3 | 0.65 |
| | Weight ratio of Crosslinker/Silane coupling agent | 3.0 | 1.0 | 0.5 | 6.5 | 2.2 | 1.0 | 1.0 | 0.3 | 0.2 |
| Evaluation | Initial adhesion to glass (N/cm) | 26.1 | 26.2 | 26.5 | 24.0 | 24.3 | 23.9 | 26.6 | 26.8 | 26.1 |
| | Adhesion after heat-humidity test (N/cm) | 18.1 | 19.5 | 18.8 | 18.5 | 19.3 | 17.7 | 16.6 | 17.8 | 19.8 |
| | Bubble formation time (min) | 180 | 180 | 185 | 120 | 120 | 120 | 200< | 200< | 200< |
| | Light transmittance (300-1200 nm) | 91.5 | 91.5 | 91.5 | 91.5 | 91.5 | 91.5 | 91.4 | 91.4 | 91.4 |

Note)
[*1-7] as described above.

TABLE 3

|  |  | Co. Ex. 1 | Co. Ex. 2 | Co. Ex. 3 | Co. Ex. 4 | Co. Ex. 5 | Co. Ex. 6 | Co. Ex. 7 | Co. Ex. 8 |
|---|---|---|---|---|---|---|---|---|---|
| Formulation (parts by weight) | Base polymer 1[*1] | — | — | — | — | — | — | — | — |
|  | Base polymer 2[*2] | — | — | — | — | — | — | — | — |
|  | Base polymer 3[*3] | — | — | — | — | — | — | — | — |
|  | Base polymer 4[*4] | — | — | — | — | — | — | — | — |
|  | Base polymer 5[*5] | 100 | 100 | 100 | 100 | 100 | 100 | 100 | 100 |
|  | Crosslinker[*6] | 1.3 | 1.3 | 0.65 | 0.1 | 0.01 | 1.3 | 1.3 | 1.3 |
|  | Silane couping agent[*7] | 0.3 | 0.65 | 0.65 | 0.3 | 0.3 | 0.1 | 0.09 | 0.7 |
|  | Weight ratio of Crosslinker/Silane coupling agent | 4.3 | 2.0 | 1.0 | 0.3 | 0.0 | 13.0 | 14.4 | 1.9 |
| Evaluation | Initial adhesion to glass (N/cm) | 19.1 | 19.4 | 23.4 | 25.6 | 26.1 | 18.8 | 18.5 | 19.2 |
|  | Adhesion after heat-humidity test (N/cm) | 6.5 | 9.1 | 10.3 | 8.1 | 3.1 | 1.1 | 1.0 | 11.5 |
|  | Bubble formation time (min) | 45 | 45 | 120 | 200< | 200< | 45 | 45 | 45 |
|  | Light transmittance (300-1200 nm) | 91.5 | 91.5 | 91.1 | 89.3 | 89.1 | 91.5 | 91.4 | 91.4 |

Note)
[*1-7] as described above.

TABLE 4

|  |  | Co. Ex. 9 | Co. Ex. 10 | Co. Ex. 11 | Co. Ex. 12 | Co. Ex. 13 | Co. Ex. 14 | Co. Ex. 15 | Co. Ex. 16 |
|---|---|---|---|---|---|---|---|---|---|
| Formulation (parts by weight) | Base polymer 1[*1] | 100 | 100 | 100 | 100 | 100 | 100 | 100 | 100 |
|  | Base polymer 2[*2] | — | — | — | — | — | — | — | — |
|  | Base polymer 3[*3] | — | — | — | — | — | — | — | — |
|  | Base polymer 4[*4] | — | — | — | — | — | — | — | — |
|  | Base polymer 5[*5] | — | — | — | — | — | — | — | — |
|  | Crosslinker[*6] | 0 | 0 | 0 | 0.01 | 0.09 | 0.7 | 1.3 | 1.3 |
|  | Silane couping agent[*7] | 0.1 | 0.3 | 0.65 | 0.65 | 0.09 | 0.09 | 0.3 | 0.65 |
|  | Weight ratio of Crosslinker/Silane coupling agent | 0.0 | 0.0 | 0.0 | 0.0 | 1.0 | 7.8 | 4.3 | 2.0 |
| Evaluation | Initial adhesion to glass (N/cm) | 0.0 | 0.0 | 0.0 | 20.5 | 19.3 | 18.8 | 23.3 | 23.1 |
|  | Adhesion after heat-humidity test (N/cm) | 0.0 | 0.0 | 0.0 | 1.1 | 1 | 1.3 | 9.9 | 10.4 |
|  | Bubble formation time (min) | 200< | 200< | 200< | 200< | 200< | 130 | 110 | 110 |
|  | Light transmittance (300-1200 nm) | 91.4 | 91.3 | 91.4 | 91.3 | 91.3 | 91.4 | 91.5 | 91.5 |

Note)
[*1-7] as described above.

TABLE 5

|  |  | Co. Ex. 17 | Co. Ex. 18 | Co. Ex. 19 | Co. Ex. 20 | Co. Ex. 21 | Co. Ex. 22 |
|---|---|---|---|---|---|---|---|
| Formulation (parts by weight) | Base polymer 1[*1] | — | — | — | — | — | — |
|  | Base polymer 2[*2] | — | — | — | — | — | — |
|  | Base polymer 3[*3] | 100 | 100 | 100 | — | — | — |
|  | Base polymer 4[*4] | — | — | — | 100 | 100 | 100 |
|  | Base polymer 5[*5] | — | — | — | — | — | — |
|  | Crosslinker[*6] | 0.1 | 0.1 | 0.1 | 0.7 | 0.7 | 0.7 |
|  | Silane couping agent[*7] | 0.1 | 0.3 | 0.7 | 0.1 | 0.3 | 0.7 |
|  | Weight ratio of Crosslinker/Silane coupling agent | 1.0 | 0.3 | 0.1 | 7.0 | 2.3 | 1.0 |
| Evaluation | Initial adhesion to glass (N/cm) | 22.1 | 22.0 | 23.5 | 18.8 | 18.9 | 18.5 |
|  | Adhesion after heat-humidity test (N/cm) | 1.3 | 10.5 | 13.5 | 1.3 | 10.5 | 14.8 |
|  | Bubble formation time (min) | 200< | 200< | 200< | 110 | 110 | 110 |
|  | Light transmittance (300-1200 nm) | 89.6 | 89.7 | 89.6 | 90.2 | 90.2 | 90.2 |

Note)
[*1-7] as described above.

[Evaluation Results]

As shown in Tables 1 and 2, the solar cell sealing films of Examples 1-20 show suppressed bubble formation, high initial adhesion and suppressed reduction of the adhesion under the conditions of high temperature and high humidity, compared with those of the Comparative Examples. In particular, as for the sealing films of Examples 3, 8, 9, 14, 19 and 20 which have a weight ratio of the crosslinker to the silane coupling agent of 0.2 to 0.5, the bubble formation is markedly suppressed, and the adhecion is notably enhanced. The values of the weight ratio of the crosslinker to the silane coupling agent are those which are rounded off to one decimal place. In addition, the sealing films of Examples 1-20 have the light transmittance similar to that of the conventional sealing films prepared using EVA (Comparative 1-8), and are suitable for a solar cell sealing film.

INDUSTRIAL APPLICABILITY

The present invention provides a solar cell which can keep power generation efficiency high over a long period of time from the initial operation.

DESCRIPTION OF REFERENCE NUMBER

11 Transparent front side protection material
12 Backside protection material
13A Front side sealing film
13B Backside sealing film
14 Photovoltaic elements
21 Glass plate
23 Solar cell sealing film

What is claimed is:

1. A solar cell sealing film comprising ethylene-methyl methacrylate copolymer, a crosslinker and a silane coupling agent, wherein the crosslinker is contained in an amount of 0.1 to 0.3 part by weight based on 100 parts by weight of the ethylene-methyl methacrylate copolymer, and the silane coupling agent is contained in an amount of 0.3 to 0.65 part by weight based on 100 parts by weight of the ethylene-methyl methacrylate copolymer, and the weight ratio of the crosslinker to the silane coupling agent is in the range of 0.2 to 0.5, and
wherein the ethylene-methyl methacrylate copolymer has a methyl methacrylate content of 25 to 35% by weight.

2. The solar cell sealing film according to claim 1, wherein the crosslinker is an organic peroxide.

3. The solar cell sealing film according to claim 2, wherein the organic peroxide is a dialkyl peroxide.

4. The solar cell sealing film according to claim 1, wherein the silane coupling agent is a methacryloxy-type silane coupling agent.

5. A solar cell obtained by using the solar cell sealing film according to claim 1.

* * * * *